United States Patent
Kato et al.

(10) Patent No.: US 8,963,050 B2
(45) Date of Patent: Feb. 24, 2015

(54) APPARATUS FOR AND METHOD OF HEAT-TREATING THIN FILM ON SURFACE OF SUBSTRATE

(75) Inventors: Shinichi Kato, Kyoto (JP); Hiroki Kiyama, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 150 days.

(21) Appl. No.: 13/272,657

(22) Filed: Oct. 13, 2011

(65) Prior Publication Data

US 2012/0093492 A1 Apr. 19, 2012

(30) Foreign Application Priority Data

Oct. 14, 2010 (JP) ................ 2010-231093

(51) Int. Cl.
*F27D 11/00* (2006.01)
*H05B 7/18* (2006.01)
(Continued)

(52) U.S. Cl.
CPC .............. *F27B 17/0025* (2013.01); *F27D 7/02* (2013.01); *H01L 21/67109* (2013.01); *H01L 21/67115* (2013.01)
USPC .......... 219/385; 219/383; 219/444.1; 392/411

(58) Field of Classification Search
CPC .......... F27B 17/0025; H01L 21/67115; H01L 21/67109; F27D 7/02; H05B 3/00; B01L 7/00; A47J 36/2483
USPC .......... 392/407–408, 411–416, 418; 219/411, 219/444.1, 200, 201, 209, 210, 220, 383, 219/384, 385; 118/725, 50.1; 134/94.1, 134/95.1, 95.2, 95.3; 250/492.21, 492.3, 250/493.1, 423 P, 504 R See application file for complete search history.

(56) References Cited

U.S. PATENT DOCUMENTS 4,486,652 A * 12/1984 Muka et al. ............... 219/553
4,698,486 A * 10/1987 Sheets ...................... 219/390
(Continued)

FOREIGN PATENT DOCUMENTS

JP 05-259064 10/1993
JP 2007-026762 3/2007
(Continued)

OTHER PUBLICATIONS

Wikipedia (KW: Flashtube), Rare gas flashtube spectral outputs. JPG.*

(Continued)

*Primary Examiner* — Dana Ross
*Assistant Examiner* — Gyounghyun Bae
(74) *Attorney, Agent, or Firm* — Ostrolenk Faber LLP (57) ABSTRACT

A semiconductor wafer having a surface with a thin film formed thereon is transported into a chamber and held by a holder. After an atmosphere provided in the chamber is replaced, flashes of light are directed from flash lamps in a light irradiation part toward the semiconductor wafer to perform a baking process on the thin film. The irradiation of the semiconductor wafer with light from halogen lamps in the light irradiation part also starts at the same time as the irradiation thereof with the flashes of light. The flashes of light emitted for an extremely short period of time and having a high intensity allow the surface temperature of the thin film to rise momentarily. This prevents the occurrence of abnormal grain growth resulting from prolonged baking in the film.

19 Claims, 4 Drawing Sheets

(51) Int. Cl.
*H05B 3/68* (2006.01)
*F26B 3/30* (2006.01)
*F27B 17/00* (2006.01)
*F27D 7/02* (2006.01)
*H01L 21/67* (2006.01)

(56) References Cited

U.S. PATENT DOCUMENTS

| | | | | |
|---|---|---|---|---|
| 4,890,575 | A * | 1/1990 | Ito et al. | 118/723 HC |
| 5,073,698 | A * | 12/1991 | Stultz | 219/405 |
| 5,356,476 | A * | 10/1994 | Foster et al. | 118/725 |
| 6,614,005 | B1 * | 9/2003 | Walk et al. | 219/390 |
| 6,842,582 | B2 * | 1/2005 | Morimoto et al. | 392/416 |
| 7,115,837 | B2 * | 10/2006 | Timans et al. | 219/405 |
| 7,157,340 | B2 * | 1/2007 | Ito et al. | 438/301 |
| 7,183,229 | B2 * | 2/2007 | Yamanaka | 438/795 |
| 7,317,870 | B2 * | 1/2008 | Timans et al. | 392/416 |
| 7,358,462 | B2 * | 4/2008 | Timans | 219/390 |
| 7,763,553 | B2 * | 7/2010 | Ito et al. | 438/795 |
| 7,793,611 | B2 * | 9/2010 | Oladeji | 118/667 |
| 7,800,081 | B2 * | 9/2010 | Moffatt et al. | 250/492.2 |
| 2002/0082261 | A1 * | 6/2002 | Kashiwagi et al. | 514/249 |
| 2002/0084261 | A1 * | 7/2002 | Yamazaki | 219/390 |
| 2002/0179589 | A1 * | 12/2002 | Morita et al. | 219/411 |
| 2003/0089132 | A1 * | 5/2003 | Kusuda | 65/29.18 |
| 2004/0084143 | A1 * | 5/2004 | Ivanov et al. | 156/345.11 |
| 2006/0110531 | A1 * | 5/2006 | Chang et al. | 427/248.1 |
| 2007/0019032 | A1 * | 1/2007 | Maekawa et al. | 347/45 |
| 2008/0008837 | A1 | 1/2008 | Shiba et al. | 427/372.2 |
| 2008/0069550 | A1 * | 3/2008 | Timans et al. | 392/411 |
| 2008/0190909 | A1 * | 8/2008 | Yokouchi | 219/385 |
| 2008/0226272 | A1 * | 9/2008 | Kasai et al. | 392/418 |
| 2008/0260938 | A1 * | 10/2008 | Ikeda et al. | 427/66 |
| 2008/0308537 | A1 * | 12/2008 | Klostermann et al. | 219/121.66 |
| 2009/0104721 | A1 * | 4/2009 | Hirakata et al. | 438/29 |
| 2009/0121157 | A1 * | 5/2009 | Moffatt et al. | 250/492.2 |
| 2009/0133715 | A1 | 5/2009 | Maekawa | |
| 2009/0166351 | A1 * | 7/2009 | Yokomori | 219/492 |
| 2009/0197403 | A1 * | 8/2009 | Honda et al. | 438/585 |
| 2009/0245761 | A1 * | 10/2009 | Nakajima | 392/416 |
| 2009/0253751 | A1 * | 10/2009 | Miyaji et al. | 514/341 |
| 2010/0068898 | A1 * | 3/2010 | Moffatt et al. | 438/799 |
| 2010/0099268 | A1 * | 4/2010 | Timans | 438/761 |
| 2010/0180918 | A1 | 7/2010 | Maekawa | |
| 2010/0273333 | A1 * | 10/2010 | Kato | 438/795 |
| 2012/0048310 | A1 | 3/2012 | Maekawa | |

FOREIGN PATENT DOCUMENTS

| | | |
|---|---|---|
| JP | 2009-260025 | 11/2009 |
| JP | 2010-045113 | 2/2010 |
| JP | 2010-192663 | 9/2010 |

OTHER PUBLICATIONS

Office Action issued by Japanese Patent Office on Feb. 18, 2014 in connection with corresponding Japanese application No. 2010-231093 and English translation thereof.

* cited by examiner

APPARATUS FOR AND METHOD OF HEAT-TREATING THIN FILM ON SURFACE OF SUBSTRATE

BACKGROUND OF THE INVENTION

1. Field of the Invention

The present invention relates to a heat treatment apparatus and a heat treatment method for performing the process of baking a thin film formed on a surface of a thin sheet-like precision electronic substrate, such as a semiconductor wafer and a glass substrate for a liquid crystal display device (hereinafter referred to simply as a "substrate").

2. Description of the Background Art

Thin film formation on the substrate is an indispensable key technique for the manufacture of semiconductor devices and liquid crystal displays. For example, a resist film and an anti-reflective film are formed on a wafer in a photolithographic process for patterning on a semiconductor wafer. Also, an interlayer dielectric film for insulation and a metal film for electrode interconnection are formed on a surface of a semiconductor wafer in some cases. Further, a polycrystalline or amorphous film of silicon (Si) is formed on a glass substrate for a liquid crystal display device.

Techniques widely used for the formation of these thin films include a PVD (physical vapor deposition) process such as vacuum evaporation and sputtering, a CVD (chemical vapor deposition) process in which a film is deposited by a chemical reaction, and a coating process such as spin coating. When any of these techniques is used, there are cases where the process of baking a thin film formed on a substrate is performed. For a thin film formed by a coating process, it is necessary to evaporate a solvent in a coating solution. A thin film formed by sputtering and a CVD process is baked in some cases.

The conventional process of baking a thin film has been carried out by placing a substrate having a surface with a thin film formed thereon by the aforementioned various techniques on a hot plate and then by heating the thin film. For example, U.S. Patent Application Publication No. 2008/0008837 discloses a technique in which a coating solution for BARC (bottom anti-reflection coating) which is a type of anti-reflective film is applied to a substrate by spin coating, and the substrate is placed and heated on a hot plate, whereby the anti-reflective film is subjected to the baking process.

However, the process of baking a thin film by heating on a hot plate as disclosed in U.S. Patent Application Publication No. 2008/0008837 presents a problem such that abnormal grain growth is prone to occur in the film. Specifically, crystal grains in the film are made coarse by heating, and the abnormal growth of some of the crystal grains results in asperities on a boundary between the thin film and an underlying substrate and on a grain boundary in some cases. Under the circumstances of further developments for finer patterns in recent years, such asperities become an impediment to high-precision patterning.

SUMMARY OF THE INVENTION

The present invention is intended for a heat treatment apparatus for performing a baking process on a thin film formed on a surface of a substrate.

According to one aspect of the present invention, the heat treatment apparatus comprises: a chamber for receiving a substrate therein, the substrate having a surface with a thin film formed thereon; a holding part for holding the substrate within the chamber; a gas supply part for supplying a processing gas into the chamber; an exhaust part for exhausting an atmosphere from the chamber; a halogen lamp for irradiating the substrate held by the holding part with light to control the substrate at a predetermined temperature; and a flash lamp for irradiating the substrate held by the holding part with flashes of light.

The flashes of light are directed onto the substrate having the surface with the thin film formed thereon to perform the baking process on the thin film. This allows the surface temperature of the thin film to rise momentarily and to fall rapidly, thereby preventing the occurrence of abnormal grain growth in the film during the baking.

Preferably, the gas supply part includes a cleaning gas supply part for supplying a cleaning gas which reacts with contaminants deposited in the chamber to remove the contaminants.

The contaminants deposited in the chamber by the baking process of the thin film are removed, whereby the contaminants are prevented from being deposited onto the substrate.

Preferably, the heat treatment apparatus further comprises a blowoff plate provided in opposed relation to the surface of the substrate held by the holding part, and including a plurality of discharge holes bored therethrough and disposed at a uniform density in a region of the blowoff plate opposed to the surface of the substrate, the blowoff plate being configured to spray the processing gas supplied from the gas supply part through the discharge holes toward the substrate.

Thus, the processing gas is supplied equally to the surface of the substrate.

Preferably, the heat treatment apparatus further comprises a rotating part for rotating the substrate held by the holding part in the plane of a main surface of the substrate.

Thus, the irradiation with light from the halogen lamp and the supply of the processing gas are performed uniformly in the plane of the substrate surface.

Preferably, the exhaust part includes a pressure reduction part for reducing the pressure of an atmosphere provided in the chamber to a pressure lower than atmospheric pressure.

This improves the replacement efficiency of the atmosphere in the chamber.

The present invention is also intended for a method of heat-treating a thin film formed on a surface of a substrate by performing a baking process on the thin film.

According to one aspect of the present invention, the method comprises the steps of: (a) putting a substrate into a chamber, the substrate having a surface with a thin film formed thereon; (b) exhausting an atmosphere from the chamber; (c) supplying a processing gas into the chamber; (d) irradiating the substrate put in the chamber with light from a halogen lamp to control the substrate at a predetermined temperature; and (e) irradiating the substrate put in the chamber with flashes of light from a flash lamp.

The flashes of light are directed onto the substrate having the surface with the thin film formed thereon to perform the baking process on the thin film. This allows the surface temperature of the thin film to rise momentarily and to fall rapidly, thereby preventing the occurrence of abnormal grain growth in the film during the baking.

Preferably, the method further comprises the step of (f) supplying a cleaning gas which reacts with contaminants deposited in the chamber to remove the contaminants.

The contaminants deposited in the chamber by the baking process of the thin film are removed, whereby the contaminants are prevented from being deposited onto the substrate.

Preferably, the method further comprises the step of (g) rotating the substrate put in the chamber in the plane of a main surface of the substrate.

Thus, the irradiation with light from the halogen lamp and the supply of the processing gas are performed uniformly in the plane of the substrate surface.

Preferably, the step (b) includes the substep of reducing the pressure of an atmosphere provided in the chamber to a pressure lower than atmospheric pressure.

This improves the replacement efficiency of the atmosphere in the chamber.

It is therefore an object of the present invention to prevent abnormal grain growth in a film during baking.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment according to the present invention will now be described in detail with reference to the drawings.

Figure 1:
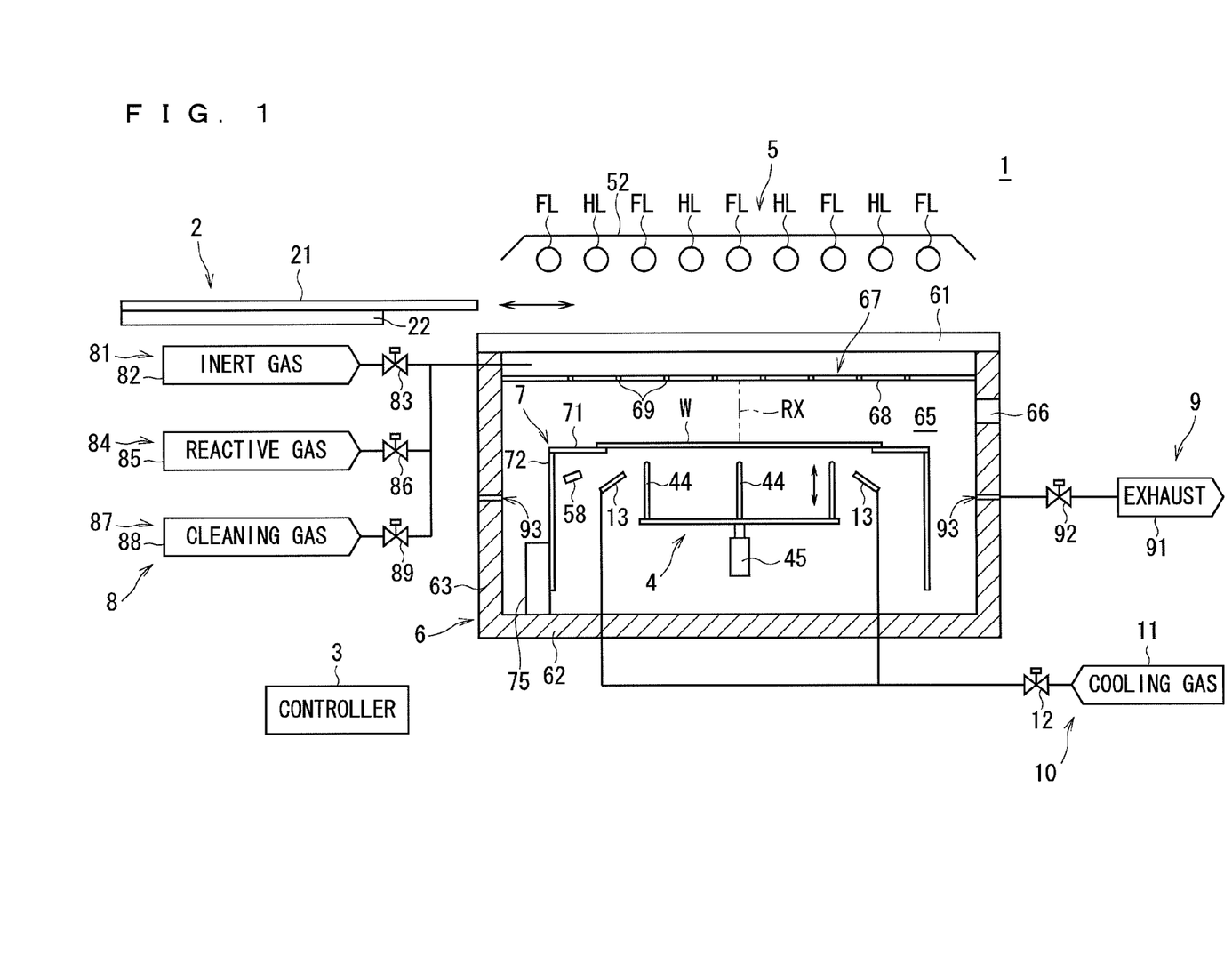
FIG. 1 is a view showing the configuration of principal parts of a heat treatment apparatus according to the present invention.

FIG. 1 is a view showing the configuration of principal parts of a heat treatment apparatus 1 according to the present invention. The heat treatment apparatus 1 is a flash lamp annealer for irradiating a substantially circular semiconductor wafer W serving as a substrate and having a front surface with a thin film formed thereon with flashes of light to perform the process of baking the thin film. In FIG. 1 and the subsequent figures, the dimensions of components and the number of components are shown in exaggeration or in simplified form, as appropriate, for the sake of easier understanding.

The heat treatment apparatus 1 principally includes a chamber 6 of a substantially cylindrical configuration for receiving a semiconductor wafer W therein, a holder 7 for holding a semiconductor wafer W within the chamber 6, a light irradiation part 5 for irradiating a semiconductor wafer W within the chamber 6 with halogen light (light from a halogen light source) and flashes of light, a gas supply part 8 for supplying a processing gas into the chamber 6, and an exhaust part 9 for exhausting an atmosphere from the chamber 6. The heat treatment apparatus 1 further includes a controller 3 for controlling these components to cause the components to perform a thin film baking process.

The chamber 6 is provided under the light irradiation part 5, and includes a chamber side portion 63 having a generally cylindrical inner wall and a chamber bottom portion 62 covering the bottom of the chamber side portion 63. A space surrounded by the chamber side portion 63 and the chamber bottom portion 62 is defined as a heat treatment space 65. A chamber window 61 is mounted to block the top opening of the chamber 6.

The chamber window 61 forming the ceiling of the chamber 6 is a disk-shaped member made of quartz, and serves as a quartz window that transmits light emitted from the light irradiation part 5 therethrough into the heat treatment space 65. The chamber bottom portion 62 and the chamber side portion 63, which form the main body of the chamber 6, are made of, for example, a metal material such as stainless steel with high strength and high heat resistance.

The chamber window 61 and the chamber side portion 63 are sealed with an O-ring not shown for the purpose of maintaining the hermeticity of the heat treatment space 65. Specifically, the O-ring is inserted between an underside peripheral portion of the chamber window 61 and the chamber side portion 63 to prevent any gas from flowing into and out of the heat treatment space 65 through a gap therebetween.

The chamber side portion 63 has a transport opening 66 for the transport of a semiconductor wafer W therethrough into and out of the chamber 6. The transport opening 66 is openable and closable by a gate valve not shown. When the transport opening 66 is opened, a transport robot outside the apparatus is allowed to transport a semiconductor wafer W through the transport opening 66 into and out of the chamber 6. When the transport opening 66 is closed, the heat treatment space 65 is an enclosed space so that the ventilation of air between the heat treatment space 65 and the outside is interrupted.

The holder 7 includes a holding ring 71 and a ring support 72. The holding ring 71 is a plate-like member in the form of an annular ring, and is made of quartz (or may be made of silicon carbide (SiC) and the like). The annular ring-shaped holding ring 71 has an outside diameter greater than the diameter of a semiconductor wafer W, and an inside diameter slightly smaller than the diameter of the semiconductor wafer W. This enables an inner peripheral portion of the holding ring 71 to support a peripheral edge portion of the semiconductor wafer W.

The ring support 72 is a member supporting the holding ring 71 in a horizontal position from below. The ring support 72 is rotatable about a rotation axis RX extending in a vertical direction through the center of the holding ring 71. The ring support 72 is rotated by a rotation driver 75 including a motor. The rotation driver 75 which might produce dust may be provided outside the chamber 6, in which case the driving force of the rotation driver 75 is transmitted by magnetic attraction in a non-contacting manner to the ring support 72.

By placing the peripheral edge portion of a semiconductor wafer W on the inner peripheral portion of the holding ring 71, the holder 7 holds the semiconductor wafer W in a horizontal position in the heat treatment space 65 of the chamber 6. Then, the rotation driver 75 rotates the holder 7 to thereby cause the semiconductor wafer W held by the holder 7 to rotate about the rotation axis RX in the plane of the main surface thereof. It should be noted that the rotation axis RX extends through the center of the semiconductor wafer W because the center of the semiconductor wafer W held by the holding ring 71 coincides with the center of the holding ring 71 itself.

A wafer elevator 4 is provided below and inside the holding ring 71 of the holder 7. The wafer elevator 4 includes a plurality of (in this preferred embodiment, three) lift pins 44, and an air cylinder 45 for moving the lift pins 44 upwardly and downwardly. The vertical positions of the upper ends of the three lift pins 44 are included in the same horizontal plane. The three lift pins 44 are collectively moved vertically up and down by the air cylinder 45. When the air cylinder 45 moves the three lift pins 44 upwardly, the tips of the respective lift pins 44 protrude upwardly from the holding ring 71. When the air cylinder 45 moves the lift pins 44 downwardly, the tips of the respective lift pins 44 are lowered below the holding ring 71.

Figure 2:
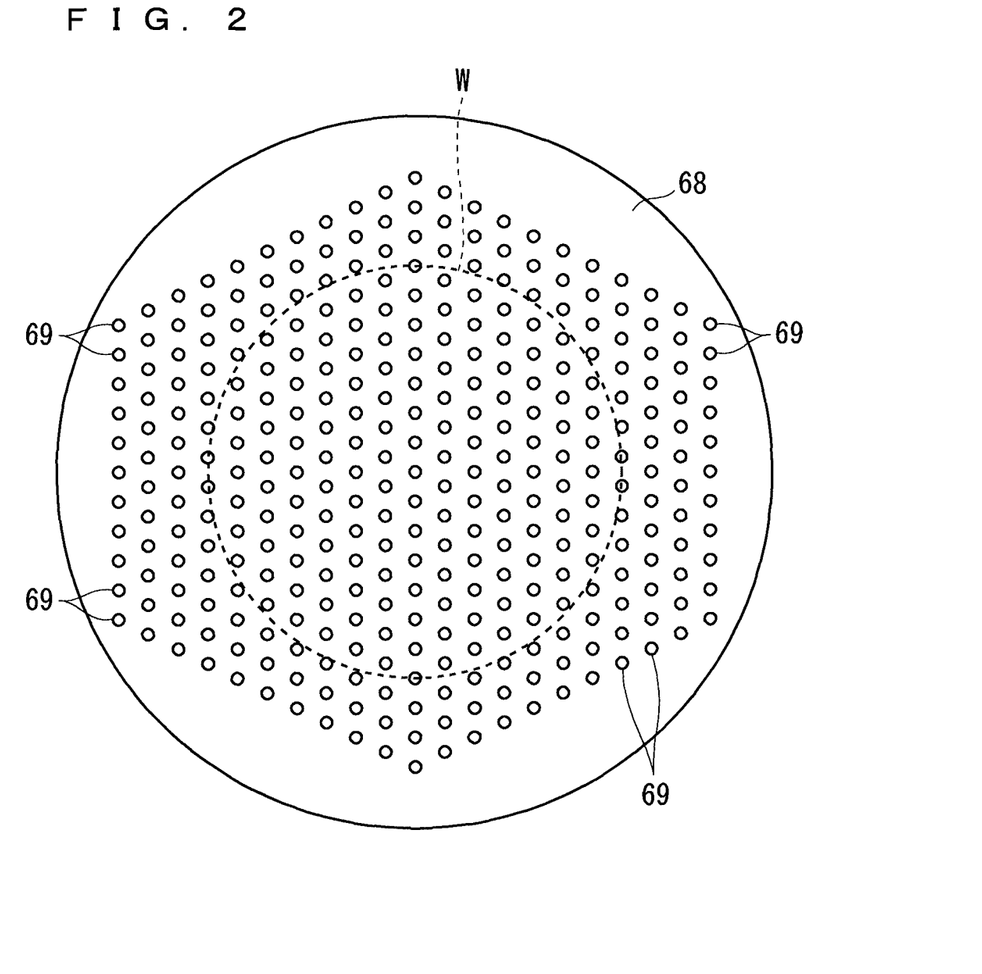
FIG. 2 is a plan view of a blowoff plate.

A blowoff plate 68 is provided in an upper portion of the heat treatment space 65 and immediately under the chamber window 61. FIG. 2 is a plan view of the blowoff plate 68. The blowoff plate 68 is a disk-shaped member made of quartz, and is provided in a horizontal position so as to be opposed to the front surface of a semiconductor wafer W held by the holder 7. As shown in FIG. 2, the blowoff plate 68 has a large number of discharge holes 69 bored therethrough. Specifically, the discharge holes 69 are disposed at a uniform density at least in a region of the blowoff plate 68 opposed to the front surface of the semiconductor wafer W held by the holder 7.

The gas supply part 8 supplies a processing gas to a gas reservoir space 67 defined between the chamber window 61 and the blowoff plate 68. The gas supply part 8 according to this preferred embodiment includes an inert gas supply part 81, a reactive gas supply part 84, and a cleaning gas supply part 87. The inert gas supply part 81 includes an inert gas supply source 82 and a valve 83, and supplies an inert gas to the gas reservoir space 67 by opening the valve 83. The reactive gas supply part 84 includes a reactive gas supply source 85 and a valve 86, and supplies a reactive gas to the gas reservoir space 67 by opening the valve 86. Likewise, the cleaning gas supply part 87 includes a cleaning gas supply source 88 and a valve 89, and supplies a cleaning gas to the gas reservoir space 67 by opening the valve 89. The inert gas supply source 82, the reactive gas supply source 85 and the cleaning gas supply source 88 may be constructed using a gas storage tank and a feeding pump provided in the heat treatment apparatus 1 or may employ a utility system in a factory in which the heat treatment apparatus 1 is installed.

The term "inert gas" used herein refers to a gas having a poor reactivity with a thin film formed on the front surface of a semiconductor wafer W and the material of the semiconductor wafer W. Examples of the inert gas include nitrogen ($N_2$), argon (Ar), and helium (He). The term "reactive gas" used herein refers to a gas having a high reactivity with a thin film formed on the front surface of a semiconductor wafer W. Examples of the reactive gas include oxygen ($O_2$), hydrogen ($H_2$), chlorine ($Cl_2$), water vapor ($H_2O$), hydrogen chloride (HCl), ozone ($O_3$), ammonia ($NH_3$), a bromine (Br) compound gas, and a fluorine (F) compound gas. The term "cleaning gas" used herein refers to a gas which reacts with contaminants deposited in the chamber 6 which will be described later. Examples of the cleaning gas include oxygen ($O_2$), hydrogen ($H_2$), chlorine ($Cl_2$), water vapor ($H_2O$), hydrogen chloride (HCl), ozone ($O_3$), and a fluorine (F) compound gas. The inert gas, the reactive gas and the cleaning gas are collectively referred to herein as a "processing gas" for processing or treatment. The reactive gas and the cleaning gas include a common gaseous species, and one of the reactive gas supply part 84 and the cleaning gas supply part 87 may serve also as the other.

The valve 83 and the valve 86 may be opened at the same time to supply a gas mixture of the inert gas and the reactive gas into the heat treatment space 65 of the chamber 6. For example, while oxygen is supplied from the reactive gas supply part 84, helium, argon or nitrogen may be supplied from the inert gas supply part 81, so that an atmosphere of a gas mixture of these gases is created in the heat treatment space 65. Alternatively, while nitrogen is supplied from the reactive gas supply part 84, helium or argon may be supplied from the inert gas supply part 81. For the supply of such a gas mixture, a flow control mechanism (for example, a mass flow controller) may be provided in each of the reactive gas supply part 84 and the inert gas supply part 81 to control the flow rate of each of the reactive gas and the inert gas, thereby controlling the concentration of the reactive gas in the heat treatment space 65. In this case, a concentration meter is preferably provided in the chamber 6 to monitor the concentration of the reactive gas in the heat treatment space 65.

The processing gas supplied from the gas supply part 8 to the gas reservoir space 67 is discharged downwardly through the discharge holes 69 bored through the blowoff plate 68. At this time, the resistance of fluid passing through the gas reservoir space 67 is lower than that of fluid passing through the discharge holes 69. For this reason, the processing gas supplied from the gas supply part 8 temporarily flows in a spreading manner within the gas reservoir space 67, and is then discharged uniformly from the discharge holes 69. The discharge holes 69 are disposed at a uniform density in the region of the blowoff plate 68 opposed to the semiconductor wafer W held by the holder 7. The processing gas from the blowoff plate 68 is accordingly equally sprayed onto the entire front surface of the semiconductor wafer W held by the holder 7.

The exhaust part 9 includes an exhaust device 91 and a valve 92, and exhausts the atmosphere provided in the chamber 6 through an exhaust outlet 93 by opening the valve 92. The exhaust outlet 93 is a slit provided in the chamber side portion 63 so as to surround the holder 7. The vertical position of the exhaust outlet 93 is not higher than that of the semiconductor wafer W held by the holder 7, and is preferably slightly below that of the semiconductor wafer W. The exhaust part 9 exhausts the atmosphere through the exhaust outlet 93 in the form of a slit provided so as to surround the holder 7, thereby discharging the gas equally from around the semiconductor wafer W held by the holder 7.

A vacuum pump and a utility exhaust system in a factory in which the heat treatment apparatus 1 is installed may be used as the exhaust device 91. When a vacuum pump is employed as the exhaust device 91 to exhaust the atmosphere provided in the heat treatment space 65 which is an enclosed space while the processing gas is not supplied from the gas supply part 8, the atmosphere provided in the chamber 6 is reduced in pressure to a vacuum atmosphere. When the vacuum pump is not used as the exhaust device 91, the pressure of the atmosphere provided in the chamber 6 is reduced to a pressure lower than atmospheric pressure by exhausting the atmosphere provided in the heat treatment space 65 while the processing gas is not supplied from the gas supply part 8.

The light irradiation part 5 is provided over the chamber 6. The light irradiation part 5 includes a plurality of (in this preferred embodiment, 15; although only five are shown in FIG. 1 for purposes of illustration) flash lamps FL, a plurality of (in this preferred embodiment, 15; although only four are shown in FIG. 1 for purposes of illustration) halogen lamps HL, and a reflector 52 provided so as to cover all of the flash lamps FL and the halogen lamps HL from above. The light irradiation part 5 directs halogen light and flashes of light respectively from the halogen lamps HL and the flash lamps FL through the chamber window 61 and the blowoff plate 68 both made of quartz onto a semiconductor wafer W held by the holder 7 in the chamber 6.

In this preferred embodiment, xenon flash lamps are used as the flash lamps FL. A xenon flash lamp FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, an electrical discharge across the electrodes causes electricity stored in the capacitor to flow momentarily in the glass tube, and xenon atoms or molecules are excited at this time to cause light emission. The xenon flash lamp FL has the property of being capable of emitting extremely intense light as compared with a light source that stays lit continuously because the electrostatic energy previously stored in the capacitor is converted into an ultrashort light pulse ranging from 0.1 to 100 milliseconds.

On the other hand, a halogen lamp HL is a filament-type light source which passes current through a filament made of tungsten (W) and disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamp HL has the properties of having a long life and being capable of continuously emitting intense light as compared with a typical incandescent lamp.

Each of the flash lamps FL and the halogen lamps HL is a rod-shaped lamp having an elongated cylindrical shape. The flash lamps FL and the halogen lamps HL are arranged in a plane so that the longitudinal directions thereof are in parallel with each other along the main surface of a semiconductor wafer W held by the holder 7 (that is, in a horizontal direction). Thus, a plane defined by the arrangement of the flash lamps FL and the halogen lamps HL is also a horizontal plane. In the arrangement, the flash lamps FL and the halogen lamps HL are disposed in an alternating manner, as shown in FIG. 1.

Also, the reflector 52 is provided over the plurality of flash lamps FL and the plurality of halogen lamps HL so as to cover all of the flash lamps FL and the halogen lamps HL. A fundamental function of the reflector 52 is to reflect the light emitted from the flash lamps FL and the halogen lamps HL toward the holder 7. The reflector 52 is a plate made of an aluminum alloy. A surface of the reflector 52 (a surface which faces the flash lamps FL and the halogen lamps HL) is roughened by abrasive blasting to produce a stain finish thereon.

A radiation thermometer 58 is provided below the holding ring 71 of the holder 7. The radiation thermometer 58 measures the intensity of radiant light (infrared light or visible light) emitted from the back surface of a semiconductor wafer W held by the holder 7 to measure the temperature of the semiconductor wafer W. The result of temperature measurement made by the radiation thermometer 58 is transmitted to the controller 3. The radiation thermometer 58 is provided below the holding ring 71 to prevent halogen light from the halogen lamps HL and flashes of light from the flash lamps FL from serving as disturbance light and entering the radiation thermometer 58. When light shielding against disturbance light is properly provided using a filter and the like, the radiation thermometer 58 may be provided above the holding ring 71.

The halogen lamps HL which continuously emit light direct halogen light onto a semiconductor wafer W held by the holder 7 to control the semiconductor wafer W at a predetermined temperature. In this process, the controller 3 controls the amount of power supply to the halogen lamps HL so that the temperature of the semiconductor wafer W measured with the radiation thermometer 58 reaches the predetermined temperature previously set. In other words, the controller 3 effects feedback control of the temperature of the semiconductor wafer W which is temperature-controlled by the irradiation with light from the halogen lamps HL, based on the result of measurement of the radiation thermometer 58.

The heat treatment apparatus 1 further includes a cooling gas supply part 10 for supplying a cooling gas to a semiconductor wafer W held by the holder 7 to cool the semiconductor wafer W. The cooling gas supply part 10 includes a cooling gas supply source 11, a valve 12, and cooling nozzles 13. In this preferred embodiment, the multiple cooling nozzles 13 are provided below the holding ring 71 of the holder 7. The cooling gas supply part 10 is configured to spray the cooling gas from the multiple cooling nozzles 13 equally onto the back surface of the semiconductor wafer W held by the holder 7 by opening the valve 12. The term "cooling gas" refers to a gas which has a high thermal conductance and is prone to absorb heat. Examples of the cooling gas include helium and argon. It should be noted that only a single cooling nozzle 13 may be provided if the cooling gas supply part 10 is capable of supplying the cooling gas equally to the back surface of the semiconductor wafer W held by the holder 7.

The heat treatment apparatus 1 further includes a shutter mechanism 2 provided alongside the light irradiation part 5 and the chamber 6. The shutter mechanism 2 includes a shutter plate 21, and a sliding drive mechanism 22. The shutter plate 21 is a plate opaque to halogen light, and is made of titanium (Ti), for example. The sliding drive mechanism 22 causes the shutter plate 21 to slidably move in a horizontal direction, thereby bringing the shutter plate 21 into and out of a light shielding position lying between the light irradiation part 5 and the chamber window 61. When the sliding drive mechanism 22 moves the shutter plate 21 forward, the shutter plate 21 is inserted into the light shielding position to provide isolation between the light irradiation part 5 and the chamber window 61. Thus, light directed from the halogen lamps HL in the light irradiation part 5 toward the holder 7 in the heat treatment space 65 is intercepted. On the other hand, when the sliding drive mechanism 22 moves the shutter plate 21 backward, the shutter plate 21 is retracted from the light shielding position lying between the light irradiation part 5 and the chamber window 61 to open the space lying under the light irradiation part 5.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

Figure 3:
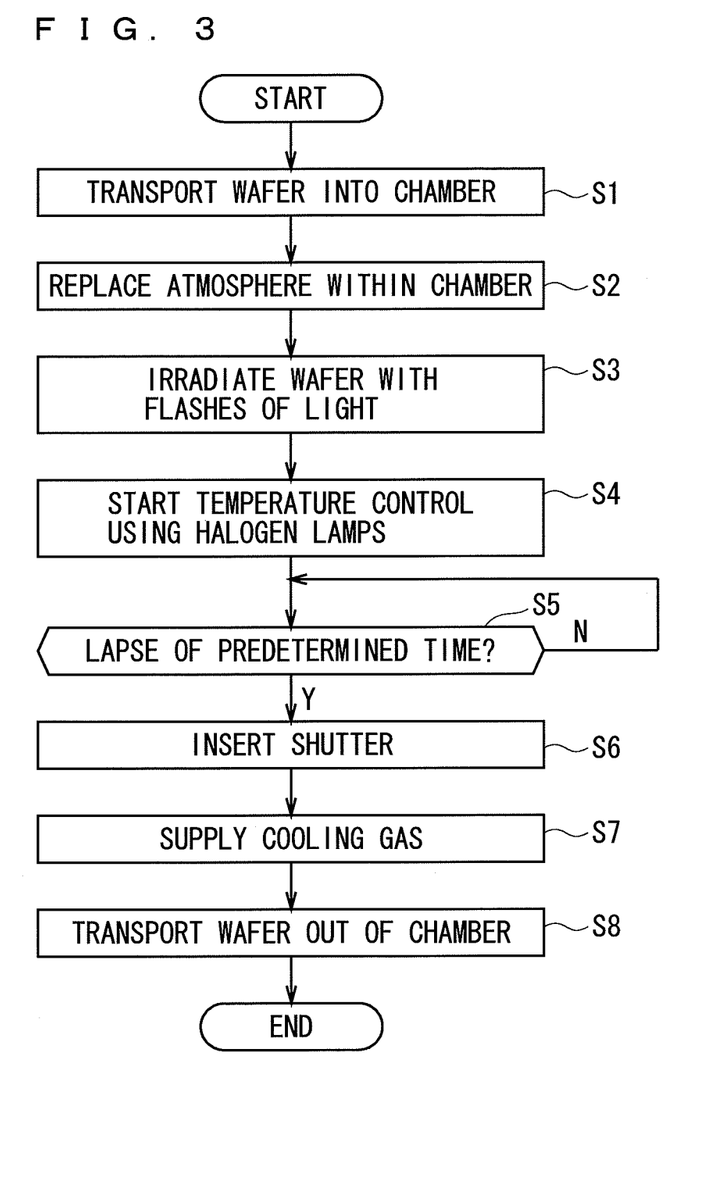
FIG. 3 is a flow diagram showing a procedure for the processing or treatment of a semiconductor wafer in the heat treatment apparatus of FIG. 1.
Figure 4:
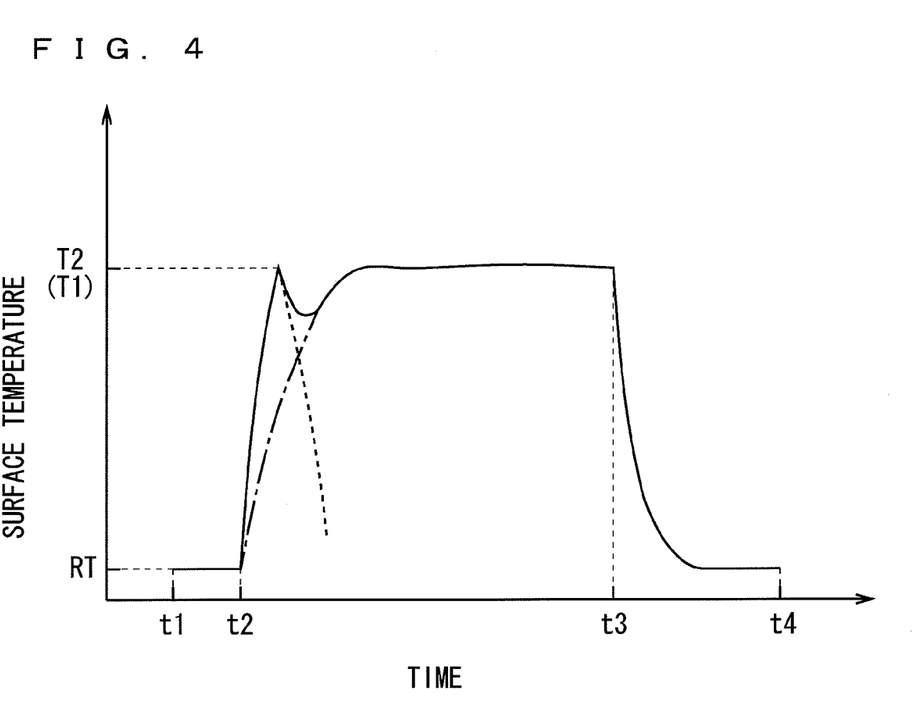
FIG. 4 is a graph showing changes in the surface temperature of a semiconductor wafer.

Next, a procedure for the processing or treatment of a semiconductor wafer W in the heat treatment apparatus 1 will be described. FIG. 3 is a flow diagram showing the procedure for the processing or treatment of a semiconductor wafer W in the heat treatment apparatus 1. FIG. 4 is a graph showing changes in the surface temperature of a semiconductor wafer W (more strictly speaking, the surface temperature of a thin film). The procedure for the processing or treatment in the heat treatment apparatus 1 which will be described below proceeds under the control of the controller 3 over the operating mechanisms of the heat treatment apparatus 1.

First, the transport opening 66 is opened by opening the gate valve not shown. A transport robot outside the heat treatment apparatus 1 transports a semiconductor wafer W to be subjected to the processing or treatment through the transport opening 66 into the chamber 6 (in Step S1). The semiconductor wafer W to be subjected to the processing or treatment herein is a semiconductor substrate having a front surface with a thin film formed thereon. The thin film formed on the front surface of the semiconductor wafer W may be an organic film or a metallic film. Examples of the organic film include a resist film including a chemically amplified resist film adapted to an excimer laser, an anti-reflective film including a BARC (bottom anti-reflection coating) and a TARC (top anti-reflection coating), a ferroelectric film such as a PZT (lead zirconate titanate) film, and an interlayer dielectric film including a low-k film. Examples of the metallic film include films of nickel (Ni), platinum (Pt), tungsten (W), cobalt (Co), titanium (Ti), and alloys thereof. Also, a thin film including a high-k film containing hafnium (Hf) and the like, and an ITO (indium tin oxide) film may be formed on the front surface of the semiconductor wafer W.

An apparatus different from the heat treatment apparatus 1 according to the present invention produces such a film on the front surface of a semiconductor wafer W, and the semiconductor wafer W is transported into the chamber 6 of the heat treatment apparatus 1. The thin film may be produced on the front surface of the semiconductor wafer W by any one of the techniques including the PVD (physical vapor deposition) process such as sputtering, the CVD (chemical vapor deposition) process in which a film is deposited by a chemical reaction, and the coating process such as spin coating which have been described above.

A hand of the transport robot which holds the semiconductor wafer W having the front surface with the thin film formed thereon moves forward through the transport opening 66 into the chamber 6, and stops at a position immediately over the wafer elevator 4. Subsequently, the three lift pins 44 move upwardly to receive the semiconductor wafer W from the hand. Time t1 shown in FIG. 4 is the time at which the lift pins 44 receive the semiconductor wafer W. Thereafter, the hand of the transport robot moves backward out of the chamber 6, and the transport opening 66 is closed, whereby the heat treatment space 65 of the chamber 6 becomes an enclosed space. The three lift pins 44 supporting the received semiconductor wafer W move downwardly below the holding ring 71. In the course of the downward movement of the lift pins 44, the semiconductor wafer W is transferred from the lift pins 44 to the holding ring 71, and is supported by the inner peripheral portion of the holding ring 71. Thus, the semiconductor wafer W with the thin film formed thereon which is to be subjected to the processing or treatment is held in a horizontal position by the holder 7 within the chamber 6.

After the heat treatment space 65 becomes an enclosed space and the semiconductor wafer W is held by the holder 7, the replacement of an atmosphere within the chamber 6 is made (in Step S2). To improve replacement efficiency in this preferred embodiment, the exhaust part 9 exhausts the atmosphere from the heat treatment space 65 while the gas supply part 8 supplies no processing gas thereinto, whereby the pressure of the atmosphere provided in the chamber 6 is temporarily reduced to a pressure lower than atmospheric pressure. After the pressure of the atmosphere provided in the chamber 6 is reduced to a predetermined pressure, the supply of the processing gas from the gas supply part 8 starts. The supply of the processing gas after the temporary reduction in the pressure of the atmosphere provided in the chamber 6 to a pressure lower than atmospheric pressure improves the replacement efficiency to achieve rapid replacement of the atmosphere in the chamber 6 with an atmosphere of the processing gas.

The exhaust part 9 continues exhausting the atmosphere even after the start of the supply of the processing gas from the gas supply part 8. Thus, while an atmosphere of the processing gas of a constant concentration is always maintained in the heat treatment space 65 of the chamber 6, a processing gas flow is produced such that the processing gas flowing downwardly from the discharge holes 69 of the blowoff plate 68 toward the semiconductor wafer W is discharged from around the semiconductor wafer W. In place of the temporary reduction in the pressure of the atmosphere provided in the chamber 6, the supply of the processing gas from the gas supply part 8 may be started at the same time as the start of the exhaust by means of the exhaust part 9, in which case the atmosphere in the chamber 6 is replaced with an atmosphere of the processing gas.

The processing gas used herein for supply from the gas supply part 8 into the chamber 6 is an appropriate one depending on the type of film formed on the front surface of the semiconductor wafer W and the purpose of the baking process. For example, for the hardening (what is called the PAB (post applied bake)) of the resist film, it is preferable to supply an inert gas such as nitrogen gas from the inert gas supply part 81, thereby providing an inert atmosphere in the chamber 6. For the modification process of a film surface, it is preferable to supply a reactive gas from the reactive gas supply part 84.

In this preferred embodiment, after the replacement of the atmosphere in the chamber 6, flashes of light are directed from the 15 flash lamps FL in the light irradiation part 5 toward the semiconductor wafer W held by the holder 7 at time t2 under the control of the controller 3 (in Step S3). At the same time as the irradiation with the flashes of light (i.e., at time t2), the irradiation with light from the 15 halogen lamps HL in the light irradiation part 5 also starts under the control of the controller 3 (in Step S4). Part of the light emitted from the flash lamps FL and the halogen lamps HL travels directly toward the holder 7 within the chamber 6, and the remaining light is reflected once from the reflector 52, and then travels into the chamber 6.

The flashes of light emitted from the flash lamps FL are intense flashes of light emitted for an extremely short period of time ranging from about 0.1 to about 100 milliseconds because the previously stored electrostatic energy is converted into such ultrashort light pulses. Upon irradiation with such intense flashes of light, the surface temperature of the thin film formed on the front surface of the semiconductor wafer W momentarily rises to a treatment temperature T2. The process of baking the thin film formed on the front surface of the semiconductor wafer W is performed by the flash heating for such a short period of time. The treatment temperature T2 that is a maximum temperature reached by the surface of the thin film is not higher than 600° C., and shall be 150° C. in this preferred embodiment.

Changes in the surface temperature contributed by the irradiation with halogen light from the halogen lamps HL are indicated by the dash-and-dot line in FIG. 4, and changes in the surface temperature contributed by the irradiation with flashes of light from the flash lamps FL are indicated by broken line in FIG. 4. The actual changes in the surface temperature of the thin film are the sum of the values contributed by the irradiation with halogen light and the irradiation with flashes of light, and are indicated by the solid lines in FIG. 4. As shown in FIG. 4, the surface temperature of the thin film is rapidly raised to the treatment temperature T2 momentarily by the irradiation with flashes of light from the flash lamps FL. However, such a rapid rise in temperature is a phenomenon occurring only near the front surface of the semiconductor wafer W. Substantially no changes in temperature occur at the back surface of the semiconductor wafer W. For this reason, the temperature of the surface of the film is rapidly lowered by the conduction of heat from the thin film raised in temperature rapidly to the underlying semiconductor wafer W, as indicated by the broken line in FIG. 4, when only the flashes of light are used for irradiation.

In this preferred embodiment, the irradiation with light from the halogen lamps HL starts at the same time as the irradiation with flashes of light. As indicated by the dash-and-dot line in FIG. 4, the rate of rise of the surface temperature of the thin film which is caused by the irradiation with light from the halogen lamps HL is pronouncedly low, as compared with that caused by the irradiation with flashes of light. For this reason, the irradiation with light from the halogen lamps HL hardly contributes to the rapid temperature rise at the surface of the thin film in an early stage, even when the halogen lamps HL turn on at the same time as the irradiation with the flashes of light. Unlike the flash lamps FL which emit flashes of light for a period of time ranging from 0.1 to 100 milliseconds, the halogen lamps HL stay lit continuously for the irradiation. Thus, the surface temperature of the thin film which is momentarily raised to the treatment temperature T2 by the irradiation with flashes of light and then falls rapidly is raised again by the irradiation with light from the halogen lamps HL.

The temperature of the thin film is raised to a controlled temperature T1 by the irradiation with light from the halogen lamps HL, and is maintained at the controlled temperature T1. The irradiation with light from the halogen lamps HL which raises the temperature at low speed causes substantially no temperature difference between the front and back surfaces of the semiconductor wafer W, so that the temperature of the thin film formed on the front surface of the semiconductor wafer W is measured by measuring the intensity of radiant light emitted from the back surface of the semiconductor wafer W by means of the radiation thermometer 58. Based on the result of measurement of the radiation thermometer 58, the controller 3 controls the amount of power supply to the halogen lamps HL so that the temperature of the thin film reaches the controlled temperature T1 which is not higher than 200° C. Thus, the thin film formed on the front surface of the semiconductor wafer W is maintained substantially at the controlled temperature T1. In this preferred embodiment, the controlled temperature T1 shall be 150° C. that is equal to the treatment temperature T2 reached during the irradiation with flashes of light.

A standby condition is continued for a predetermined period of time, while the thin film formed on the front surface of the semiconductor wafer W is maintained at the controlled temperature T1 by continuing the irradiation with light from the halogen lamps HL even after the irradiation with flashes of light (in Step S5). During this time period, the rotation driver 75 rotates the holder 7 to thereby rotate the semiconductor wafer W about the rotation axis RX. This supplies the processing gas discharged from the discharge holes 69 of the blowoff plate 68 equally to the entire front surface of the semiconductor wafer W, and also improves the uniformity of a within-wafer illuminance distribution of light emitted from the halogen lamps HL.

Then, at time t3, the shutter mechanism 2 inserts the shutter plate 21 into the light shielding position lying between the light irradiation part 5 and the chamber window 61 (in Step S6). The insertion of the shutter plate 21 in the light shielding position intercepts the halogen light directed from the halogen lamps HL onto the semiconductor wafer W held by the holder 7 within the chamber 6, so that the temperature of the semiconductor wafer W and the thin film falls. A time interval between the time t2 at which the irradiation with the flashes of light from the flash lamps FL is performed and the time t3 at which the irradiation with light from the halogen lamps HL is completed is one second or less. It should be noted that the halogen lamps HL may be turned off at the same time that the shutter plate 21 is inserted in the light shielding position.

After the time t3 at which the shutter plate 21 is inserted in the light shielding position, the cooling gas is sprayed from the cooling gas supply part 10 toward the back surface of the semiconductor wafer W held by the holder 7 (in Step S7). This increases the rate of temperature fall of the semiconductor wafer W and the thin film.

After the temperature of the semiconductor wafer W and the thin film is lowered by the cooling processes in Steps S6 and S7, the three lift pins 44 move upwardly to receive the semiconductor wafer W which has been supported by the holding ring 71. Thereafter, the transport opening 66 is opened again, and the hand of the transport robot moves forward through the transport opening 66 into the chamber 6, and stops at a position immediately under the semiconductor wafer W. Subsequently, the lift pins 44 move downwardly, whereby the semiconductor wafer W is transferred from the lift pins 44 to the transport robot at time t4. Then, the hand of the transport robot which has received the semiconductor wafer W moves backward out of the chamber 6, whereby the semiconductor wafer W is transported out of the chamber 6. Thus, the heat treatment apparatus 1 completes the process of baking the thin film (in Step S8).

During a time interval between the instant at which the temperature of the semiconductor wafer W is lowered and the instant at which the transport opening 66 is opened, the atmosphere provided in the chamber 6 may be replaced again. For example, when an atmosphere of the reactive gas is provided in the chamber 6 during the processing or treatment, it is desirable to replace the atmosphere of the reactive gas with an atmosphere of the inert gas. Alternatively, the atmosphere provided in the chamber 6 may be replaced with an atmosphere of air identical with that outside the apparatus.

In this preferred embodiment, the thin film formed on the front surface of the semiconductor wafer W is heated by irradiating the thin film with flashes of light from the flash lamps FL. The flashes of light emitted for an extremely short period of time and having a high intensity allow the surface temperature of the thin film to rapidly rise to the treatment temperature T2 momentarily. After the irradiation with flashes of light, the thin film is maintained at the controlled temperature T1 for a short time interval by the irradiation with light from the halogen lamps HL. A time interval between the emission of flashes of light from the flash lamps FL and the completion of the irradiation with light from the halogen lamps HL is a maximum of one second. This prevents the occurrence of abnormal grain growth resulting from prolonged baking in the film to consequently prevent asperities on a boundary between the thin film and the underlying semiconductor wafer W and on a grain boundary in the film, thereby achieving a high degree of flatness.

Also, the diameter of crystal grains in the baked thin film may be adjusted to within a suitable range by controlling the controlled temperature T1 and temperature-control time reached by the irradiation of light from the halogen lamps HL and the treatment temperature T2 reached by the irradiation with flashes of light. The controlled temperature T1 reached by the irradiation of light from the halogen lamps HL may be an appropriate temperature of not higher than 200° C. depending on the type of film formed on the front surface of the semiconductor wafer W and the purpose of the baking process.

When the type of thin film is a metal film having a high diffusion coefficient in silicon, the surface temperature of the thin film may be raised to the treatment temperature T2 in a short time, controlled subsequently at the controlled temperature T1, and then lowered rapidly, whereby abnormal diffusion of the metal element in the semiconductor wafer W is prevented.

In some cases, the process of baking a thin film as described above causes various contaminants to be deposited on the inner walls of the chamber 6. For example, sublimates produced from the baked thin film are deposited on the inner walls of the chamber 6, and the reactive gas reacts with metal in the inner wall surfaces of the chamber 6 to form contaminants. When such contaminants are deposited in the chamber 6, the cleaning gas which reacts with the contaminants is supplied from the cleaning gas supply part 87 into the chamber 6. Thus, the contaminants are decomposed by the reaction with the cleaning gas, whereby the contaminants are removed from the chamber 6. This prevents the contaminants from being deposited on a semiconductor wafer W and contaminating the semiconductor wafer W. While the cleaning gas is supplied from the cleaning gas supply part 87, light may be directed from the flash lamps FL and/or the halogen lamps HL into the chamber 6 to accelerate the decomposition of the contaminants.

While the preferred embodiment according to the present invention has been described hereinabove, various modifications of the present invention in addition to those described above may be made without departing from the scope and spirit of the invention. For example, the cooling gas is supplied in the aforementioned preferred embodiment after the time t3 at which the shutter plate 21 is inserted in the light shielding position. However, the cooling gas may be supplied from the cooling gas supply part 10 while the irradiation with light from the halogen lamps HL is continued after the irradiation with flashes of light. The cooperation between the irradiation with light from the halogen lamps HL and the spraying of the cooling gas allows the semiconductor wafer W to be controlled suitably at a relatively low temperature not lower than room temperature and not higher than 200° C. In particular, the concurrent use of the cooling gas is preferable for the temperature control to near room temperature.

The controlled temperature T1 reached by the use of the halogen lamps HL and the treatment temperature T2 reached during the irradiation with flashes of light are equal to each other in the aforementioned preferred embodiment. However, the controlled temperature T1 and the treatment temperature T2 may be different from each other. When the controlled temperature T1 is so low that the crystal grains in the film hardly grow, the time period for the irradiation of light from the halogen lamps HL may be one to 30 seconds.

In the aforementioned preferred embodiment, the inner peripheral portion of the holding ring 71 of the holder 7 supports the semiconductor wafer W. In place of this, support pins may be used to support the back surface of the semiconductor wafer W.

In place of or in addition to the blowoff plate 68 including the multiple discharge holes 69 bored therethrough, a nozzle for the supply of the processing gas may be provided near the semiconductor wafer W held by the holder 7.

The type of processing gas supplied from the gas supply part 8 may be changed in the course of the processing. For the formation of a metallic film, for example, on the front surface of a semiconductor wafer W, a procedure to be described below may be employed. An inert gas is initially supplied from the inert gas supply part 81 into the chamber 6, and the semiconductor wafer W is irradiated with flashes of light in an atmosphere of the inert gas, so that a reaction occurs between the metal film and the underlying silicon. Next, the gaseous species is changed by supplying a reactive gas which reacts with the metal film from the reactive gas supply part 84 into the chamber 6. This reactive gas reacts with unreacted metal in the upper surface of the thin film, so that an etching process proceeds. Thereafter, the inert gas is supplied again from the inert gas supply part 81 to replace the atmosphere provided in the chamber 6 with an atmosphere of the inert gas, and the remaining thin film is heated by the irradiation with flashes of light.

For the heating of a semiconductor wafer W having a front surface with a high-k film or an ITO film formed thereon, a gas mixture of oxygen and helium (although argon or nitrogen may be used in place of helium) or a gas mixture of nitrogen and helium (although argon may be used in place of helium) may be supplied into the chamber 6. In this process, concentration control is effected by controlling the flow rate of oxygen or nitrogen in the heat treatment space 65 while monitoring the concentration of oxygen or nitrogen in the heat treatment space 65 with a concentration meter. The oxidation and reduction reactions of the thin film are controlled by controlling the concentration of oxygen or nitrogen in the heat treatment space 65, whereby a desired electrical characteristic (capacitance) is obtained.

Although the 15 flash lamps FL are provided in the light irradiation part 5 according to the aforementioned preferred embodiment, the present invention is not limited to this. Any number of flash lamps FL may be provided in the light irradiation part 5. The flash lamps FL are not limited to the xenon flash lamps, but may be krypton flash lamps. Also, the number of halogen lamps HL provided in the light irradiation part 5 is not limited to 15. Any number of halogen lamps HL may be provided in the light irradiation part 5.

Moreover, a substrate to be treated by the heat treatment technique according to the present invention is not limited to a semiconductor wafer, but may be a glass substrate for use in a liquid crystal display device, and a substrate for a solar cell. For example, a polycrystalline or amorphous thin film of silicon or germanium (Ge) may be formed on a glass substrate and be doped with impurities such as boron (B) or arsenic (As), following which the aforementioned heat treatment apparatus 1 performs the heating treatment of the thin film.

While the invention has been described in detail, the foregoing description is in all aspects illustrative and not restrictive. It is understood that numerous other modifications and variations can be devised without departing from the scope of the invention.

What is claimed is:

1. A heat treatment apparatus for performing a baking process on a thin film formed on a surface of a substrate, comprising:

a chamber for receiving a substrate therein, the substrate having a surface with a thin film formed thereon;

a holding part for holding said substrate within said chamber;

a gas supply part for supplying a processing gas into said chamber;

an exhaust part for exhausting an atmosphere from said chamber;

a halogen lamp for irradiating said substrate held by said holding part with light to control said substrate at a predetermined temperature;

a flash lamp for irradiating said substrate held by said holding part with flashes of light of which the irradiation time is 0.1 to 100 milliseconds; and a lamp control part configured to control said halogen lamp and said flash lamp so that the irradiation with light by said halogen lamp and the irradiation with flashes of light by said flash lamp start simultaneously from the beginning of said baking process and so that the irradiation with light from said halogen lamp continues beyond the irradiation with flashes of light.

2. The heat treatment apparatus according to claim 1, wherein
said halogen lamp is configured to irradiate said substrate with light, thereby controlling said substrate at a temperature not higher than 200° C.

3. The heat treatment apparatus according to claim 1, wherein
said gas supply part includes
a reactive gas supply part for supplying a reactive gas which reacts with the thin film formed on the surface of said substrate.

4. The heat treatment apparatus according to claim 1, wherein
said gas supply part includes
a cleaning gas supply part for supplying a cleaning gas which reacts with contaminants deposited in said chamber to remove the contaminants.

5. The heat treatment apparatus according to claim 1, further comprising
a blowoff plate provided in opposed relation to the surface of said substrate held by said holding part, and including a plurality of discharge holes bored therethrough and disposed at a uniform density in a region of the blowoff plate opposed to the surface of said substrate, said blowoff plate being configured to spray the processing gas supplied from said gas supply part through said discharge holes toward said substrate.

6. The heat treatment apparatus according to claim 1, further comprising
a rotating part for rotating said substrate held by said holding part in the plane of a main surface of said substrate.

7. The heat treatment apparatus according to claim 1, wherein
said exhaust part includes
a pressure reduction part for reducing the pressure of an atmosphere provided in said chamber to a pressure lower than atmospheric pressure.

8. The heat treatment apparatus according to claim 1, wherein
said lamp control part is configured to control said halogen lamp to cause the surface temperature of said substrate to rise again, after the temperature has decreased after the irradiation with flashes of light.

9. The heat treatment apparatus according to claim 1, further comprising
a cooling gas supply part for supplying a cooling gas to said substrate held by said holding part to cool said substrate.

10. The heat treatment apparatus according to claim 1, further comprising
a shutter mechanism for intercepting light between said substrate held by said holding part and said halogen lamp.

11. A method of heat-treating a thin film formed on a surface of a substrate by performing a baking process on the thin film, comprising the steps of:
(a) putting a substrate into a chamber, the substrate having a surface with a thin film formed thereon;
(b) exhausting an atmosphere from said chamber;
(c) supplying a processing gas into said chamber;
(d) irradiating said substrate put in said chamber with light from a halogen lamp to control said substrate at a predetermined temperature; and
(e) irradiating said substrate put in said chamber with flashes of light of which the irradiation time is 0.1 to 100 milliseconds from a flash lamp, wherein
the irradiation with light from said halogen lamp in said step (d) and the irradiation with flashes of light from said flash lamp in said step (e) start simultaneously from the beginning of said baking process, and the irradiation with light from said halogen lamp continues beyond the irradiation with flashes of light.

12. The method according to claim 11, wherein
said substrate is controlled at a temperature not higher than 200° C. in said step (d).

13. The method according to claim 11, wherein
a reactive gas which reacts with the thin film formed on the surface of said substrate is supplied into said chamber in said step (c).

14. The method according to claim 11, including a step (f) comprising supplying a cleaning gas which reacts with contaminants deposited in said chamber to remove the contaminants.

15. The method according to claim 11, further comprising a step (g) comprising rotating said substrate put in said chamber in the plane of a main surface of said substrate.

16. The method according to claim 11, wherein
said step (b) includes a substep comprising
reducing the pressure of an atmosphere provided in said chamber to a pressure lower than atmospheric pressure.

17. The method according to claim 11, wherein
the irradiation with light from said halogen lamp makes the surface temperature of said substrate to rise again after the temperature has decreased after the irradiation with flashes of light in said step (e).

18. The method according to claim 11, including a step (h) comprising supplying a cooling gas to said substrate to cool said substrate, said step (h) being performed after said step (d).

19. The method according to claim 11, wherein
a shutter is used to intercept light between said substrate put in said chamber and said halogen lamp after said step (d).

* * * * *